United States Patent [19]
Lo

[11] Patent Number: 5,949,264
[45] Date of Patent: Sep. 7, 1999

[54] DIGITAL PHASE DETECTOR AND CHARGE PUMP SYSTEM RESET AND BALANCED CURRENT SOURCE MATCHING METHODS AND SYSTEMS

[76] Inventor: Dennis C. Lo, 710 Nina La., Foster City, Calif. 94404

[21] Appl. No.: 08/758,529

[22] Filed: Nov. 29, 1996

[51] Int. Cl.⁶ .................................................. H03L 7/089
[52] U.S. Cl. ............................. 327/157; 327/148; 327/7; 331/17; 331/1 A
[58] Field of Search .................................. 327/3, 7, 142, 327/146, 147, 156, 157; 331/1 A, 17

[56] References Cited

U.S. PATENT DOCUMENTS

4,814,726  3/1989  Byrd et al. ................................... 327/7
5,485,125  1/1996  Dufour ........................................ 327/7

*Primary Examiner*—Dinh T. Le
*Attorney, Agent, or Firm*—Robert P. Sabath; Sabath & Truong

[57] ABSTRACT

A digital phase detector and charge pump circuit system reset circuit and method resets a digital phase detector according to the charge outputs between the charge pump circuits and a following loop filter. The sensing circuitry emulates portions of the circuitry of the digital phase detector and charge pump circuit system and minimizes deadband time. Current mirror portions of the charge pump circuit alternate between p-channel and n-channel devices to regularize output voltage levels produced by the charge pump circuit system.

8 Claims, 5 Drawing Sheets

FIG. 3A

DIGITAL PHASE DETECTOR AND CHARGE PUMP SYSTEM RESET AND BALANCED CURRENT SOURCE MATCHING METHODS AND SYSTEMS

FIELD OF THE INVENTION

The technical field of the present invention is digital phase detection and charge pumping methods and systems, and more particularly charge reset and balanced current source matching methods and systems for digital phase detection and charge pump systems.

BACKGROUND OF THE INVENTION

In D. Preslar and J. Siwinski in "An ECL/12L Frequency Synthesizer for AM/FM Radio with an Alive Zone Phase Comparator" at p. 20 of IEEE Transactions Consumer Electronics (1981), a delay circuit is incorporated in the digital phase detector to provide a fixed delay time. However, the delay circuit is hampered by dependency upon temperature and device process variations. This causes excessive delay times in some instances, and insufficient time delays at other times, degrading digital phase detector performance. Such fixed time delays are further additionally subject to noise in part attributable to the magnitude of digital phase detector deadband.

Byrd et al. U.S. Pat. No. 4,814,726 (1989) shows a digital phase detector and a charge pump system which resets a phase comparator responsive to sourcing and sinking currents in the charge pump circuitry of the system. A reset circuit is shown which provides fixed, excessively large time delays which permit sourcing and sinking currents in a following loop filter which are subject to excessive operational deadband characteristics between sourcing and sinking operations.

Additionally, in charge pump systems using p-channel and n-channel devices responsive to input UP and DOWN signals, output signals may vary undesireably as a result of current variations in p-channel and n-channel portions of the charge pump system.

SUMMARY OF THE INVENTION

According to the present invention, a digital phase detector and charge pump circuit system includes charging and discharging sensing circuitry which resets the digital phase detector according to the charge outputs between the charge pump circuits and a following loop filter. According to one embodiment of the present invention, a digital phase detector and charge pump circuit includes a tri-state digital phase detector, a charge pump, and charge reset circuitry including a reset control switch responsive to both up and down outputs of the phase detector. The charge pump circuit converts the tri-state outputs of the digital phase detector into charging or discharging or high-impedance output states of a following low-pass loop filter for controlling voltage-controlled oscillator (VCO) output frequency. The charge reset circuitry according to the present invention, includes charging sensing and discharging sensing circuitry which emulates the charge pump circuit to determine appropriate delay times for reset operation. When an UP output of the digital phase detector goes low, a capacitor in the charging sensing circuit is reset to ground by a controlled switch. When the UP output of the digital phase detector goes high, it turns on the source current of the charge pump circuit to charge the loop filter. In this state, the controlled switch is off and the charging sensing circuit emulates charge pump charging behavior. Similarly, when the DOWN output of the digital phase detector goes low, the capacitor in the discharging sensing circuit is charged to VCC. When the DOWN output of the digital phase detector goes high, the capacitor discharges to emulate the corresponding discharging behavior of the charge pump circuit. A resistor in the charging and discharging circuitry adds another flexibility to adjust the circuit time constant to emulate actual time requirements of a capacitor in the loop filter. The sensing capacitors in the charging and discharging circuitry according to the present invention are much smaller than the loop filter capacitor. The current sources to charge and discharge the sensing capacitors and have smaller than the sinking and sourcing current sources associated with the charge pump circuitry according to the present invention. Further according to a method of the present invention, the output from the charging and discharging circuitry is fed into a logic control circuit to reset the digital phase detector when both UP and DOWN outputs are set to logical high.

Further according to the present invention, a digital phase detector and charge pump system includes charging and discharging sensing circuitry which resets the digital phase detector with a reduced deadband VCO frequency range in which the digital phase detector and charge pump are not activated. The reduced deadband time is achieved by emulating the charging and discharging action of the charge pump circuitry to provide appropriate delay time to reset the digital phase detector.

Further according to the present invention, a charge pump system employs current mirror transistor combinations which alternate between n-channel and p-channel devices to reduce the impact of undesired variation in p-channel and n-channel current carrying levels.

DETAILED DESCRIPTION OF A PREFERRED MODE OR EMBODIMENT

Figure 1A:
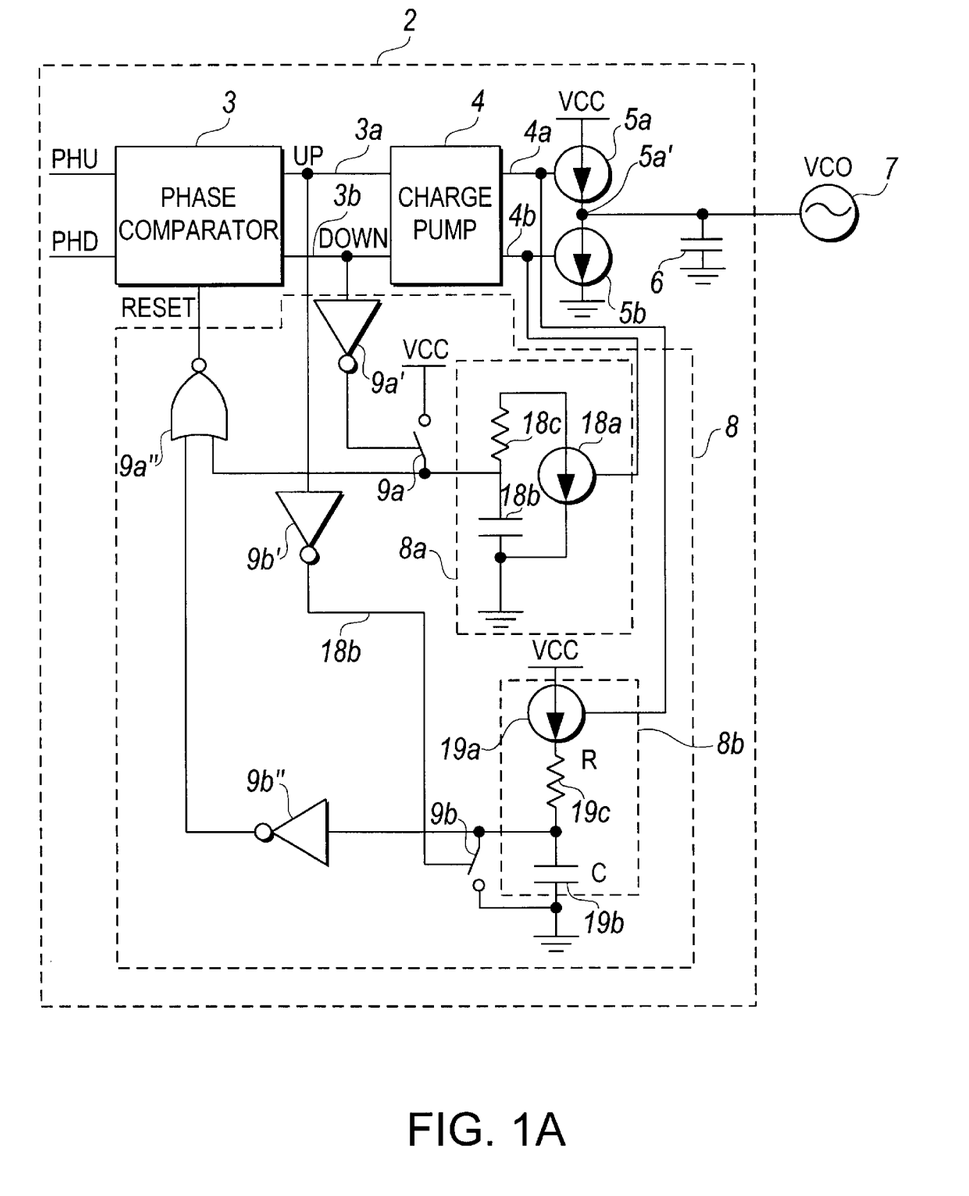
FIG. 1A is a diagram of a digital phase detector and charge pump circuit charge reset system according to the present invention.

FIG. 1A is a diagram of digital circuitry for a phase detector and charge pump circuit charge reset system 2 according to the present invention. More particularly, FIG. 1A shows phase detector and charge pump circuit charge reset system for producing output voltage controlled oscillator (VCO) signal levels based upon an input frequency signal, PHU, and a reference signal, PHD. Phase detector and charge pump circuit charge reset system 2 includes a phase comparator circuit 3, a charge pump circuit 4, first and second respective current sources 5a and 5b (i.e., sourcing and sinking current sources, respectively), a loop filter circuit comprising a capacitor 6 to ground according to one embodiment, a VCO output 7, and a reset circuit 8 according to the present invention. Phase comparator circuit 3 according to one embodiment of the present invention is a tri-state digital phase detector which receives a reference signal (PHU) and an input frequency signal (PHD) and produces UP and DOWN output signals on first and second respective output connections 3a and 3b, serving as respective inputs to charge pump circuit 4. U. L. Rohde describes tri-state digital phase detectors which can be employed in connection with the present invention in "Digital PLL Frequency Synthesizer Theory and Design" published in 1983 by Prentice Hall of Englewood Cliffs, N.Y. Charge pump Circuit 4 responds to UP and DOWN signals from phase comparator circuit 3 by providing output signals on output connectors 4a and 4b to activate respective sourcing and sinking current sources 5a and 5b. Current sources 5a and 5b are connected in series between VCC and ground, at a common node 5a' to which a loop filter circuit, comprising, according to one embodiment, a capacitor 6, is connected. An output signal on connection 4a from charge pump circuit 4 sources current to loop filter capacitor 6 from VCC to VCO output 7. An output signal from charge pump circuit 4 on connection 4b sinks current from loop filter capacitor 6 to ground. Reset circuit 8 is connected to first and second output connections 4a and 4b of charge pump circuit 4 and provides a reset output signal to phase comparator circuit 3 as will be discussed below. Charge reset circuit 8 particularly includes a discharging circuit 8a, a charging circuit 8b, a discharging switch 9a connected between VCC and discharging circuit 8a, and a charging switch 9b connected between charging circuit 8b and ground. Charge reset circuit 8 further includes a control invertor 9a' for opening and closing discharging switch 9a based upon the logical state of DOWN signals on down connection 3b from phase comparator 3, a control invertor 9b' for opening and closing charging switch 9b based upon the logical state of UP signals on up connection 3a from phase comparator 3, an inverter 9b" connected to charging circuit 8b, and a NOR gate 9a" having first and second input connections connected respectively to discharging circuit 8a and to inverter 9b". NOR gate 9a" further includes an output connection connected to phase comparator 3 for providing reset signals thereto. Discharging circuit 8a includes a current source 18a, a sensing capacitor 18b, and a resistor 18c. Charging circuit 8b includes a current source 19a, a sensing capacitor 19b, and a resistor 19c. Current source 18a of discharging circuit 8a is connected to ground in parallel with resistor 18c and sensing capacitor 18c. Current source 19a of charging circuit 8b is connected in series with resistor 19c and sensing capacitor 19b between VCC and ground. Charge reset circuit 8 receives first and second inputs from charge pump 4 at respective output connections 4a and 4b in order to sense the logical state of signals applied thereupon by charge pump 4. A first input of charge reset circuit 8 which is connected to output connection 4a activates current source 18 when a sufficient output level signal from charge pump 4 is received as a DOWN signal at output connection 4b. The effect of activating current source 18a is to discharge sensing capacitor 18b through resistor 18a according to an RC time constant determined by the capacitance of sensing capacitor 18b and the resistance of resistor 18c. Resistor 18c and capacitor 18b are connected at an output node of discharging circuit 8a. When sensing capacitor 18b is discharged, the output node of discharging circuit 8a produces a zero logical value voltage level input for NOR gate element 9a". The same output node produces a positive voltage level corresponding to a one (1) logical value input at NOR gate element 9a", when switch 9a is closed to connect the node to VCC. Such switch closure for switch 9a is produced in inverted form by a DOWN signal at connection 3b between phase comparator 3 and charge pump 4. Thus, a DOWN signal or pulse on connection 3b will produce a zero switch control signal at switch 9a, closing switch 9a to apply a logical one (1) at the input of NOR gate element 9a". The same DOWN signal at connection 3b will at a delayed time be reflected by an UP output pulse original at output connection 4b from charge pump 4. This turns on current source 18a and discharges sensing capacitor 18b at a time at which the DOWN pulse or signal at connection 3b will have expired, thereby reopening switch 9a, and enabling a zero logical state to be established at the input of NOR gate element 9a". Similarly, an UP signal or pulse at output connection 3a from phase comparator 3a will close switch 9b with an inverted logical one signal state (i.e., a zero logical state signal), grounding the output nodes of charging circuit 8b, and producing a logical one at the input of NOR gate element 9a". After the UP pulse or signal has expired at output connection 3a for phase comparator 3, charge pump 4 will create a signal or pulse related to it at output connection 4a from charge pump 4. This pulse will activate current source 19a, charging sensing capacitor 19b through resistor 19c at a rate which is a function of the product of the capacitance of sensing capacitor 19b and the resistance of resistor 19c. In a charged state, sensing capacitor 19b will produce a logical one input signal at the input of invertor 9b" and a corresponding logical zero input at the other of the inputs to NOR gate element 9a". Control switches 9a and 9b prevent reset by NOR gate element 9a" unless the respective logical states of UP and DOWN signals at connections 3a and 3b are both high.

Figure 1B:
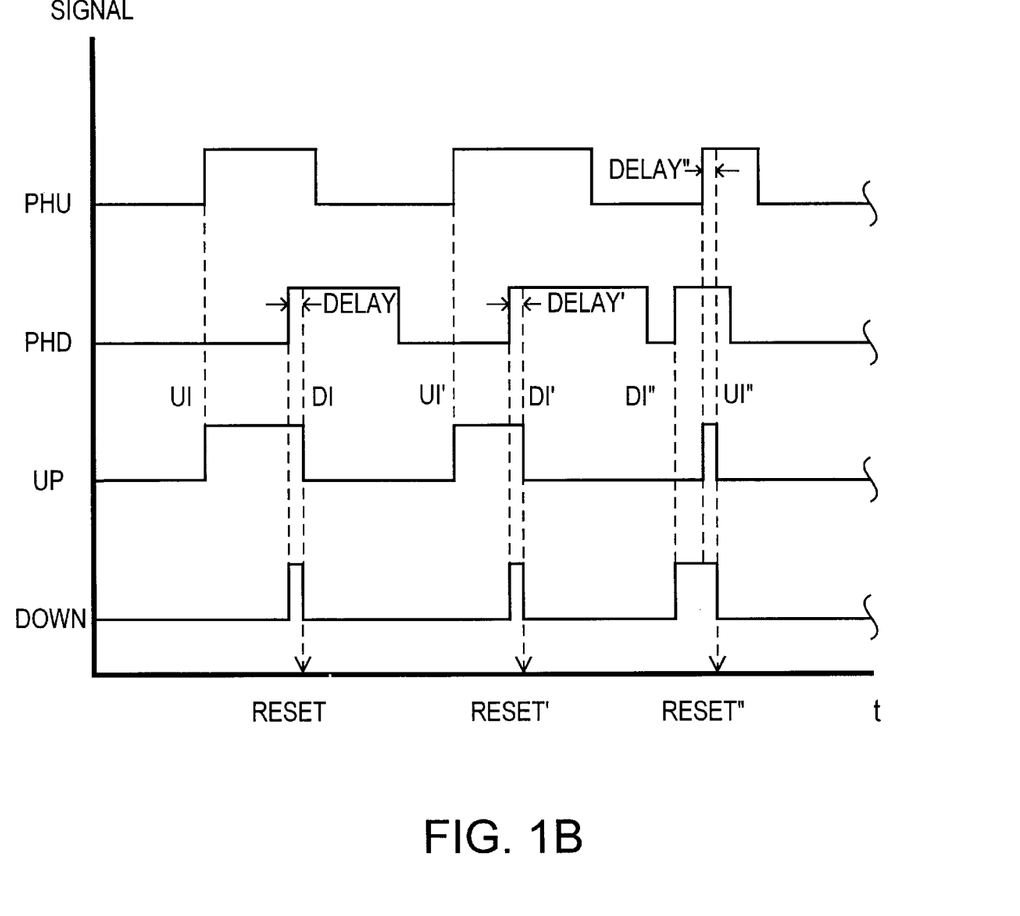
FIG. 1B is a timing diagram showing the operation of a digital phase detector and charge pump circuit charge reset system according to the present invention.

FIG. 1b is a timing diagram showing the operation of digital phase detector and charge pump circuit charge reset system 2 according to the present invention. FIG. 1B shows UP and DOWN signal pulses of indicated terms at the outputs of phase comparator 3 produced by to corresponding UP and DOWN signals PHU and PHD provided as inputs of phase comparator 3. Three reset examples are shown, i.e., RESET, RESET', and RESET". Phase comparator 3 has input signal PHU and PHD as shown, which correspond to output UP and DOWN signals for input to charge pump 4. In general, the rising edge of the PHU input initiates UP pulse at the output of phase comparator 3. Similarly, each PHD pulse rising edge generates a corresponding DOWN pulse at the phase comparator output. A reset signal is provided to phase comparator 3 whenever the second one of PHU and PHD goes up. After a time "delay" characteristic of the electric circuitry used, both UP and DOWN go to logical zero responsive to reset. If PHD goes high while UP is high, reset occurs. Further, if PHU is high and DOWN goes high, reset occurs. RESET and RESET' occur with PHU going high first after reset, while RESET" occurs with PHD going high first.

Figure 2:
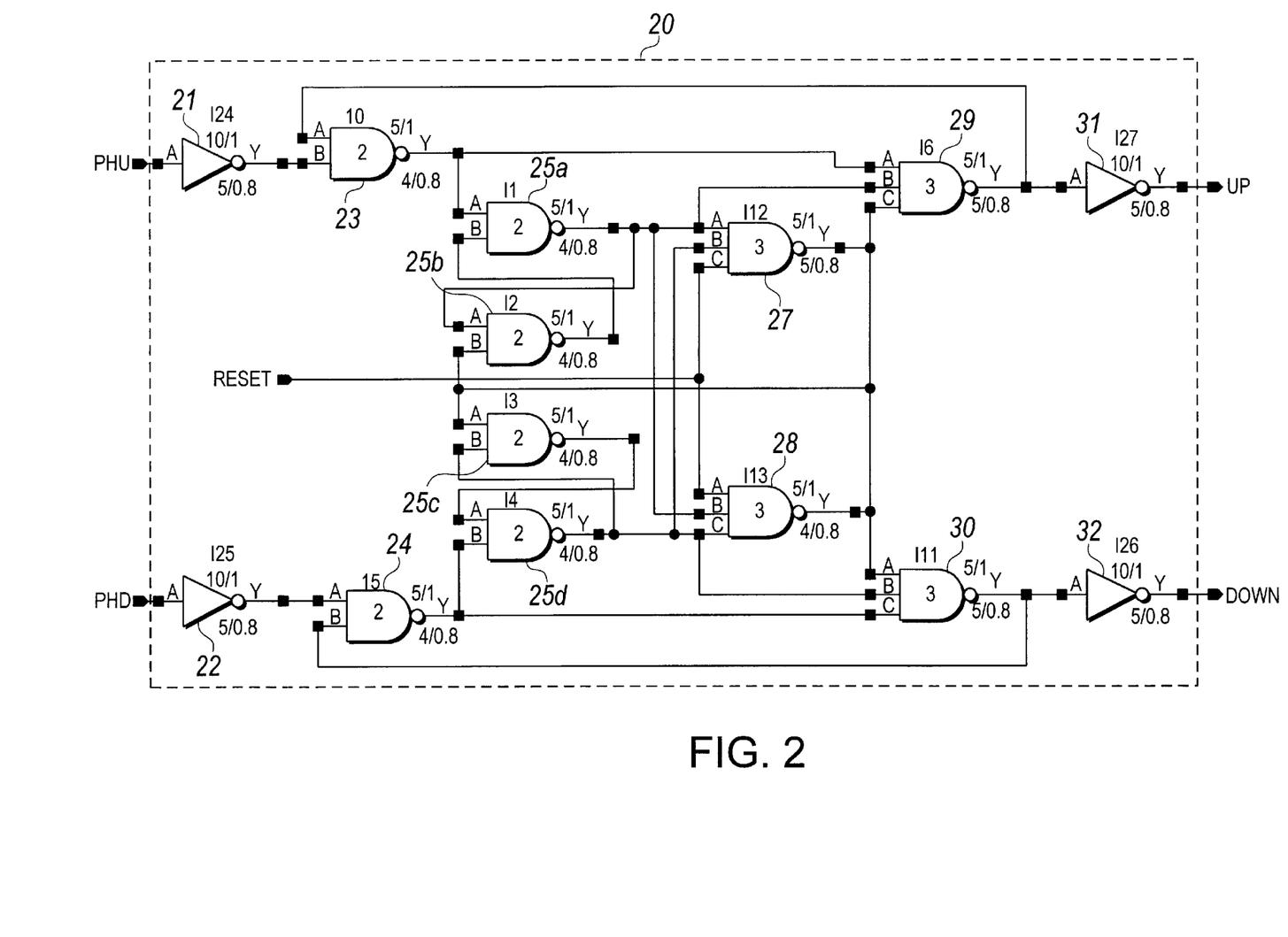
FIG. 2 is a diagram of a charge pump circuit according to the present invention.

FIG. 2 is a circuit diagram of a phase comparator 20 according to one embodiment of the present invention. Phase comparator 20 is reset along a RESET line provided from reset circuit 8 shown in FIG. 1A. Phase comparator 20 includes input inverters 21 and 22 respectively receiving signal inputs PHU and PHD, i.e., phase UP and phase DOWN input signals. Phase comparator 3 further includes NAND gates 23 and 24 respectively connected to the outputs of inverters 21 and 22. Phase detector 3 further includes a bank of NAND gates 25a, 25b, 25c, and 25d, each of which has first and second inputs, and an output. The inputs of NAND gates 25a and 25d are respectively connected to the respective outputs of NAND gates 23 and 24. The remaining inputs of NAND gates 25a and 25d are respectively connected to the respective outputs of NAND gates 25b and 25a. Phase detector 3 further includes NAND gates 27, 28, 29 and 30, each of which has first, second, and third inputs, and an output. The respective outputs of NAND gates 27 and 28 are connected to each other and to the respective inputs of NAND gates 25b and 25c. The respective outputs of NAND gates 25a and 25d are connected to first inputs of NAND gates 27, 28, 29 and 30. The respective outputs of NAND gates 23 and 24 are connected to respective second inputs of NAND gates 29 and 30. A reset signal input is respectively connected to the third inputs of NAND gates 27 and 28. The respective outputs of NAND gates 27 and 28 are connected to respective third inputs of NAND gates 29 and 30. The respective outputs of NAND gates 29 and 30 are connected to remaining inputs of respective NAND gates 23 and 24. Phase detector 3 finally includes inverters 31 and 32 connected at the outputs respectively of NAND gates 29 and 30 to produce output UP and DOWN signals. The circuitry of FIG. 2 operates in accordance with the timing diagram of FIG. 1B.

Figure 3A:
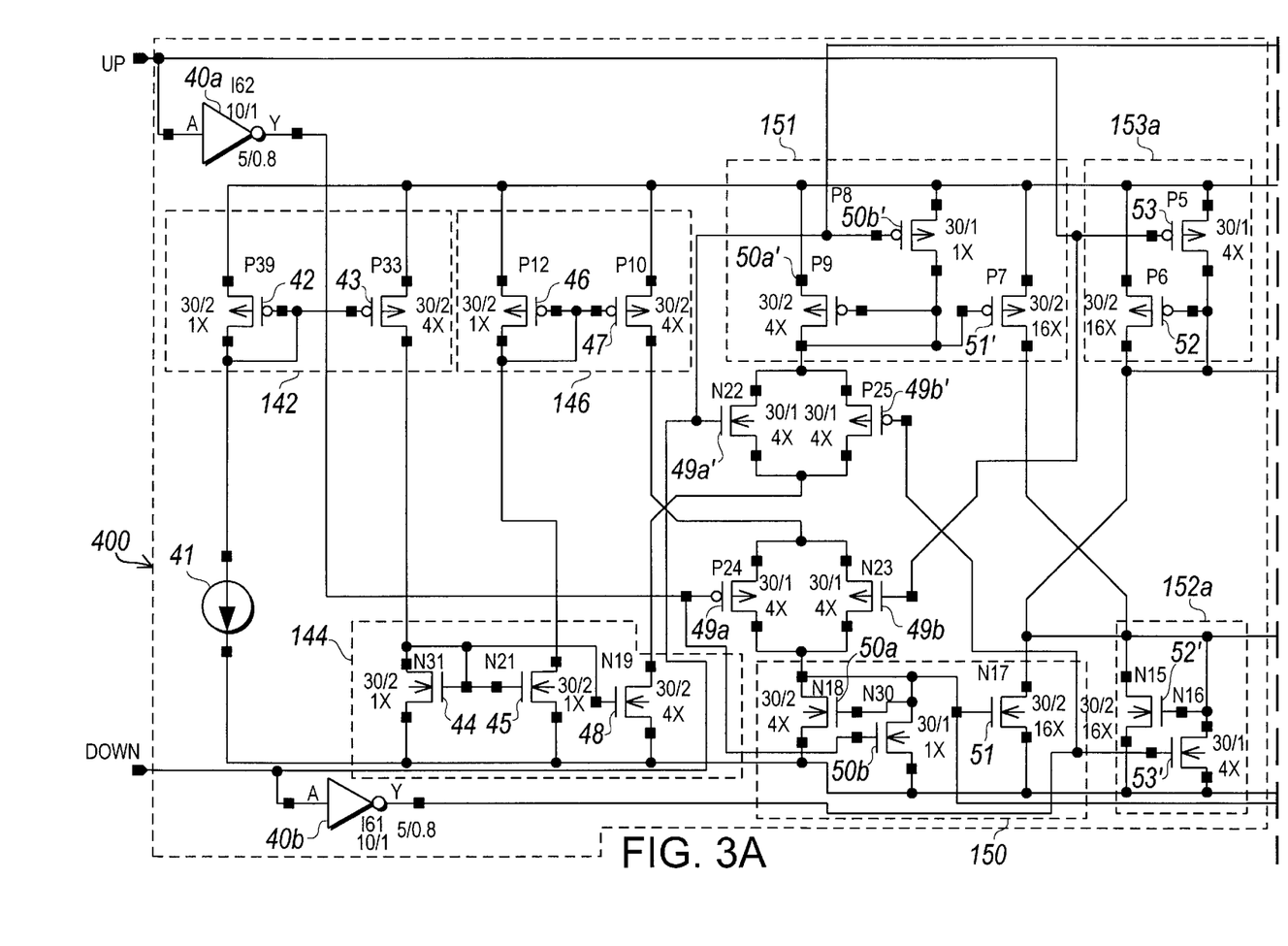
FIG. 3 is a diagram of a phase comparator circuit according to the present invention, broken into two parts, FIG. 3a and FIG. 3b for ease of viewing.
Figure 3B:
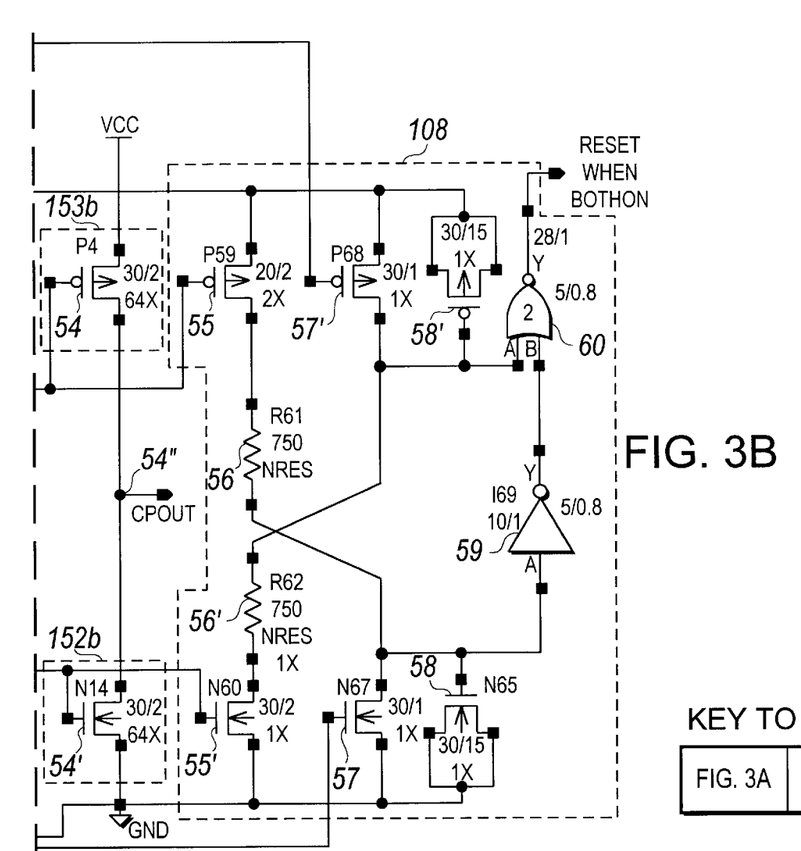

FIG. 3 is a diagram of a charge pump circuit 400 according to the present invention, broken into two parts, FIG. 3A and FIG. 3B for ease of viewing. FIGS. 3A particularly shows a first portion of charge pump circuit 400 according to an embodiment of the present invention, including input inverters 40a and 40b connected to respective input signals UP and DOWN. Charge pump circuit 400 further includes a current source 41 for driving a transistor circuit including transistors 42, 43, 44, 45, 46, 47 and 48 in successive cascading current mirror arrangements. More particularly, transistor 42 is connected in series with current source 42. Transistor 43 is connected in series with transistor 44 to produce a four-fold current increase by action of a current mirror 142 comprising transistors 42 and 43. Transistor 46 is connected in series with transistor 45, ensuring the same level of current in transistor 46 as in 44 and 45, based upon action of current mirror 144 comprising transistors 44, 45, and 48. Transistor 47 is connected in series with transistor 50a through a transmission gate comprising transistors 49a and 49b' at a four fold current increase over series connected transistors 46 and 45 by action of current mirror 146 comprising gate connected transistors 46 and 47. Similarly, transistors 48 and 50a' are connected in series through a transmission gate comprising transistors 49a' and 49b' ensuring a four-fold increase in electric current in transistors 48 and 50a' over the current level in transistor 44 by action of current mirror 144 acting through transistors 44 and 48 thereof. Transistors 42 and 43; transistors 44, 45 and 48; and transistors 46 and 47 are each gate connected. The gates of transistors 42 and 43 are connected to the drain of P-channel transistor 42; the gates of transistors 46 and 47, to the drain of P-channel transistor 46; and the gates of transistors 44, 45 and 48 to the drain of transistor 44. In general, by action of the indicated gate, source, and drain connections, the current through transistors 47 and 48 is a selected increased function of the current from current source 41 which passes through transistor 42. Moreover, the current through transistors 43 and 44 is a selected increased function of the current through transistor 42; and the current through transistors 46 and 48 is a selected other function of the current through transistor 44. Charge pump circuit 400 further includes transistors 49a, 49a', 49b, 49b', 50a, 50a', 50b, 50b', 41, 51', 52, 52', 53, and 53'. Transistors 49a' and 49b' and transistors 49a and 49b are each connected as transfer gates. Transistors 51' and 52' are connected in series to carry a current which is sixteen times the current in transistor 50a', based upon operation of a current mirror 151 comprising transistors 50a', 51', and 50b'. Transistors 51 and 52 are connected in series to carry a current which is sixteen times the current in transistor 50a, based upon operation of a current mirror 150 comprising transistors 50a, 50b, and 51. FIG. 3B is an extension of FIG. 3A, wherein charge pump circuit 400 is connected to current source transistors 54 and 54' in turn connected to each other at node 54" which leads to a loop filter, capacitor (not shown). Transistor 54 in FIG. 3B is connected to node 54" to generate 64 times the current level passing through transistor 53 in FIG. 3A of a current mirror arrangement 153A and 153B, including transistors 52, 53, and 54 (in FIG. 3B). Transistor 54' is connected to node 54" to generate 64 times the current level passing through transistor 53' in FIG. 3A of a current mirror arrangement 152a and 152b, including transistors 53', 52', and 54' (in FIG. 3B). Current source transistors 54 and 54' are additionally connected to a reset circuit 108 including transistors 55, 55', 57, 57', 58, 58', invertor 59, and NOR gate 60 to produce a reset signal when both inputs A and B to NOR gate 60 are low or set to logic state zero. Transistors 49a and 49b and transistors 49a' and 49b' are each respectively connected in parallel as transfer gates. Transistors 50b', the transfer gate combination of transistors 49a' and 49b', and transistor 48 are connected in series. Transistors 50b, the transfer gate combination of transistors 49a and 49b', and 47 are connected in series. Transistors 50a' and 50b' and transistors 50a and 50b are each respectively connected in series with each other. Transistors 51' and 52' and transistor 52 and 51 are each respectively connected to each other in series. Transistors 52 and 53 and transistors 52' and 53' are respectively each connected in parallel. Current source transistors 54 and 54', transistors 55 and 57, and transistors 57' and 55' of reset circuit 108, are each respectively connected in series. Respective resistors 56 and 56' are connected in series between respective transistors 55 and 57, and transistors 57' and 55'. Transistors 58' and 58 provide respective capacitances to VDD and ground. The mode between transistor 57' and resistor 56' (i.e., node A) is connected to transistor 58; and a first input to NOR gate 60. The node between resistor 56 and transistor 57 (i.e., node B) is in turn connected to transistor 58 and the input of inverter 59 which in turn is connected to the remaining input of NOR gate 60 which provides an output RESET signal. Transistors 58 and 58' are connected as capacitors. Thus, electric current from current source 41 is mirror multiplied by a p-channel current mirror 142 connected to an n-channel current mirror 144 in turn connected to a p-channel current mirror 146. An input UP signal in FIG. 3A opens transfer gate 49a and 49b, engaging p-channel current mirror 146 with n-channel current mirror 150 which in turn engages p-channel current mirror 153a including current source transistor 54. A DOWN signal opens transfer gate 49a; and 49b', engaging n-channel current mirror 144 with n-channel current mirror.

What is claimed is:

1. In a digital phase detector and charge pump system, including a phase comparator having first and second output phase nodes at which adjustment pulses from said phase detector are provided, a charge pump circuit having first and second input nodes, for receiving the adjustment pulses from said phase comparator, said charge pump circuit having first and second output charge pump nodes at which the adjustment pulses are provided from said charge pump circuit, a sourcing and a sinking current source connected at a common node, and a capacitor connected to said common node, said first and second output charge pump nodes being connected to said sourcing and sinking current sources, a reset circuit for resetting said phase comparator comprising:

a first charging circuit having a first logical output node coupled to a first supply voltage through a first discharging switch, wherein said first charging circuit produces a first logical output at said first logical output node in response to said first output charge pump node, and said discharging switch is controlled by said first output phase node;

a second charging circuit having a second logical output node coupled to a second phase voltage through a second discharging switch, wherein said second charging circuit produces a second logical output at said second logical output node in response to said second output charge pump node, and said discharging switch is controlled by said second output phase node; and a logic circuit having first and second inputs and a reset output, said first and second in puts connected respectively to said first and second logical output nodes, said logic circuit combining said first and second logical output nodes to produce a reset signal at said phase comparator.

2. In a digital phase detector and charge pump system, including a phase comparator having first and second output phase nodes at which adjustment pulses from said phase detector are provided, a charge pump circuit having first and second input nodes, for receiving the adjustment pulses from said phase comparator, said charge pump circuit having first and second output charge pump nodes at which the adjustment pulses are provided from said charge pump circuit, a sourcing and a sinking current source connected at a common node, and a 8 capacitor connected to said common node, said first and second output charge pump nodes being connected to said sourcing and sinking current sources, a reset circuit for resetting said phase comparator comprising:

a first charging circuit having a first logical output node coupled to a first supply voltage through a first discharging switch, wherein said first charging circuit produces a first logical output at said first logical output node in response to said first output charge pump node, and said discharging switch is controlled by said first output phase node;

a second charging circuit having a second logical output node coupled to a second supply voltage through a second discharging switch, wherein said second charging circuit produces a second logical output at said second logical output node in response to said second output charge pump node, and said discharging switch is controlled by said second output phase node; and a logic circuit having first and second inputs and a reset output, said first and second inputs connected respectively to said first and second logical output nodes, said logic circuit combining said first and second logical output nodes to produce a reset signal at said phase comparator, wherein said first logical state detection circuit includes a current source, a capacitor, and a resistor.

3. In a digital phase detector and charge pump system, including a phase comparator having first and second output phase nodes at which adjustment pulses from said phase detector are provided, a charge pump circuit having first and second input nodes, for receiving the adjustment pulses from said phase comparator, said charge pump circuit having first and second output charge pump nodes at which the adjustment pulses are provided from said charge pump circuit, a sourcing and a sinking current source connected at a common node, and a capacitor connected to said common node, said first and second output charge pump nodes being connected to said sourcing and sinking current sources, a reset circuit for resetting said phase comparator comprising:

a first charging circuit having a first logical output node coupled to a first supply voltage through a first discharging switch, wherein said first charging circuit produces a first logical output at said first logical output node in response to said first out charge ump node, and said discharging switch is controlled by said first output phase node;

a second charging circuit having a second logical output node coupled to a second supply voltage through a second discharging switch, wherein said second charging circuit produces a second logical output at said second logical output node in response to said second output charge pump node, and said discharging switch is controlled by said second output phase node; and a logic circuit having first and second inputs and a reset output, said first and second inputs connected respectively to said first and second logical output nodes, said logic circuit combining said first and second logical output nodes to produce a reset signal at said phase comparator, wherein said first logical state detection circuit includes a current source, a capacitor, and a resistor, wherein said current source is connected in parallel with said resistor and said capacitor.

4. In a digital phase detector and charge pump system, including a phase comparator having first and second output phase nodes at which adjustment pulses from said phase detector are provided, a charge pump circuit having first and second input nodes, for receiving the adjustment pulses from said phase comparator, said charge pump circuit having first and second output charge pump nodes at which the adjustment pulses are provided from said charge pump circuit, a sourcing and a sinking current source connected at a common node, and a capacitor connected to said common node, said first and second output charge pump nodes being connected to said sourcing and sinking current sources, a reset circuit for resetting said phase comparator comprising:

a first charging circuit having a first logical output node coupled to a first supply voltage through a first discharging switch, wherein said first charging circuit produces a first logical output at said first logical output node in response to said first output charge pump node, and said discharging switch is controlled by said first output phase node;

a second charging circuit having a second logical output node coupled to a second supply voltage through a second discharging switch, wherein said second charging circuit produces a second logical output at said second logical out node in response to said second output charge pump node, and said discharging switch is controlled by said second output phase node; and a logic circuit having first and second inputs and a reset output, said first and second inputs connected respectively to said first and second logical output nodes, said logic circuit combining said first and second logical output nodes to produce a reset signal at said phase comparator, wherein said second logical state detection circuit includes a current source, a capacitor, and a resistor.

5. In a digital phase detector and charge pump system, including a phase comparator having first and second output phase nodes at which adjustment pulses from said phase detector are provided, a charge pump circuit having first and second input nodes, for receiving the adjustment pulses from said phase comparator, said charge pump circuit having first and second output charge pump nodes at which the adjustment pulses are provided from said charge pump circuit, a sourcing and a sinking current source connected at a common node, and a capacitor connected to said common node, said first and second output charge pump nodes being connected to said sourcing and sinking current sources, a reset circuit for resetting said phase comparator comprising:

a first charging circuit having a first logical output node coupled to a first supply voltage through a first discharging switch, wherein said first charging circuit produces a first logical output at said first logical output node in response to said first output charge pump node, and said discharging switch is controlled by said first output phase node;

a second charging circuit having a second logical output node coupled to a second supply voltage through a second discharging switch, wherein said second charging circuit produces a second logical output at said second logical output node in response to said second output charge pump node, and said discharging switch is controlled by said second output phase node; and a logic circuit having first and second inputs and a reset output, said first and second inputs connected respectively to said first and second logical output nodes, said logic circuit combining said first and second logical output nodes to produce a reset signal at said phase comparator, wherein said second logical state detection circuit includes a current source, a capacitor, and a resistor, wherein said current source is connected in parallel with said resistor and said capacitor.

6. In a digital phase detector and charge pump system, including a phase comparator having first and second output phase nodes at which adjustment pulses from said phase detector are provided, a charge pump circuit having first and second input nodes, for receiving the adjustment pulses from said phase comparator, said charge pump circuit having first and second output charge pump nodes at which the adjustment pulses are provided from said charge pump circuit, a sourcing and a sinking current source connected at a common node, and a capacitor connected to said common node, said first and second output charge pump nodes being connected to said sourcing and sinking current sources, a reset circuit for resetting said phase comparator comprising:

a first charing circuit having a first logical output node coupled to a first supply voltage through a first discharging switch, wherein said first charging circuit produces a first logical output at said first logical output node in response to said first output charge pump node, and said discharging switch is controlled by said first output phase node;

a second charging circuit having a second logical output node coupled to a second supply voltage through a second discharging switch, wherein said second charging circuit produces a second logical output at said second logical output node in response to said second output charge pump node, and said discharging switch is controlled by said second output phase node; and a logic circuit having first and second inputs and a reset output, said first and second inputs connected respectively to said first and second logical output nodes, said logic circuit combining said first and second logical output nodes to produce a reset signal at said phase comparator, wherein said first logical state detection circuit includes a current source, a capacitor, and a resistor.

7. In a digital phase detector and charge pump system, including a phase comparator having first and second output phase nodes at which adjustment pulses from said phase detector are provided, a charge pump circuit having first and second input nodes, for receiving the adjustment pulses from said phase comparator, said charge pump circuit having first and second output charge pump nodes at which the adjustment pulses are provided from said charge pump circuit, a sourcing and a sinking current source connected at a common node, and a a capacitor connected to said common node, said first and second output charge pump nodes being connected to said sourcing and sinking current sources, a reset circuit for resetting said phase comparator comprising:

a first charging circuit having a first logical output node coupled to a first supply voltage through a first discharging switch, wherein said first charging circuit produces a first logical output at said first logical output node in response to said first output charge pump node, and said discharging switch is controlled by said first is output phase node;

a second charging circuit having a second logical output node coupled to a second supply voltage through a second discharging switch, wherein said second charging circuit produces a second logical output at said second logical output node in response to said second output charge pump node, and said discharging switch is controlled by said second output phase node; and a logic circuit having first and second inputs and a reset output, said first and second inputs connected respectively to said first and second logical output nodes, said logic circuit combining said first and second logical output nodes to produce a reset signal at said phase comparator, wherein said second logical state detection circuit includes a current source, a capacitor, and a resistor.

8. In a digital phase detector and charge pump system, including a phase comparator having first and second output phase nodes at which adjustment pulses from said phase detector are provided, a charge pump circuit having first and second input nodes, for receiving the adjustment pulses from said phase comparator, said charge pump circuit having first and second output charge pump nodes at which the adjustment pulses are provided from said charge pump circuit, a sourcing and a sinking current source connected at a common node, and a capacitor connected to said common node, said first and second output charge pump nodes being connected to said sourcing and sinking current sources, a reset circuit for resetting said phase comparator comprising:

a first charging circuit having a first logical output node coupled to a first supply voltage through a first discharging switch, wherein said first charging circuit produces a first logical output at said first logical output node in response to said first output charge pump node, and said discharging switch is controlled by said first output phase node;

a second charging circuit having a second logical output node coupled to a second supply voltage through a second discharging switch, wherein said second charging circuit produces a second logical output at said second logical output node in response to said second output charge pump node, and said discharging switch is controlled by said second output phase node; and a logic circuit having first and second inputs and a reset output, said first and second inputs connected respectively to said first and second logical output nodes, said logic circuit combining said first and second logical output nodes to produce a reset signal at said phase comparator, wherein said second logical state detection circuit includes a current source, a capacitor, and a resistor.

* * * * *